(12) United States Patent
Cha

(10) Patent No.: US 7,521,694 B2
(45) Date of Patent: Apr. 21, 2009

(54) ION SOURCE SECTION FOR ION IMPLANTATION EQUIPMENT

(75) Inventor: Kwang-Ho Cha, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 263 days.

(21) Appl. No.: 11/194,594

(22) Filed: Aug. 1, 2005

(65) Prior Publication Data

US 2006/0022144 A1 Feb. 2, 2006

(30) Foreign Application Priority Data

Aug. 2, 2004 (KR) .................... 10-2004-0060811

(51) Int. Cl.
*H01J 27/00* (2006.01)

(52) U.S. Cl. ............... 250/427; 250/423 R; 250/492.21

(58) Field of Classification Search .............. 250/426, 250/432 R, 492.2, 424, 492.21, 251, 492.3, 250/423 R–423 F, 427; 313/231.41, 230, 313/359.1, 360.1, 361.1, 362.1, 363.1; 315/111.81, 315/111.91

See application file for complete search history.

(56) References Cited

U.S. PATENT DOCUMENTS

| | | | | |
|---|---|---|---|---|
| 4,058,748 A * | 11/1977 | Sakudo et al. | ............... | 313/156 |
| 4,141,405 A * | 2/1979 | Spindt | .................... | 164/46 |
| 4,383,177 A * | 5/1983 | Keller et al. | ............. | 250/423 R |
| 4,847,504 A * | 7/1989 | Aitken | ..................... | 250/492.2 |
| 4,894,546 A * | 1/1990 | Fukui et al. | .............. | 250/423 R |
| 4,992,665 A * | 2/1991 | Mohl | ..................... | 250/423 R |
| 5,026,997 A * | 6/1991 | Benveniste | ............... | 250/492.2 |
| 5,262,652 A * | 11/1993 | Bright et al. | .............. | 250/492.2 |
| 5,420,415 A * | 5/1995 | Trueira | ................... | 250/492.21 |
| 5,576,600 A * | 11/1996 | McCrary et al. | ........ | 315/111.81 |
| 5,703,375 A * | 12/1997 | Chen et al. | ............... | 250/492.21 |
| 5,959,396 A | 9/1999 | Moreshead et al. | | |
| 6,635,880 B1 * | 10/2003 | Renau | ................... | 250/396 ML |
| 6,753,539 B2 * | 6/2004 | Kawaguchi | ............ | 250/492.21 |

FOREIGN PATENT DOCUMENTS

| | | |
|---|---|---|
| JP | 06-223771 | 8/1994 |
| JP | 10-144250 | 5/1998 |

(Continued)

OTHER PUBLICATIONS

English language abstract of Japanese Publication No. 06-223771 Aug. 12, 1994.

(Continued)

*Primary Examiner*—Jack I Berman
*Assistant Examiner*—Andrew Smyth
(74) *Attorney, Agent, or Firm*—Marger Johnson & McCollom, P.C.

(57) ABSTRACT

An ion source section of ion implantation equipment for ionizing reaction gas in an ion implantation process of semiconductor manufacturing processes is disclosed. The ion source section includes a source aperture member separable from an arc chamber and having an ion-discharging hole through which the ion beam discharges. The source aperture member consists of a first plate, a second plate adjacent to the first plate and facing the arc chamber, and a third plate to protect the exposed second plate from the ionized reaction gas.

51 Claims, 8 Drawing Sheets

FOREIGN PATENT DOCUMENTS

KR    1998-85877    12/1998

OTHER PUBLICATIONS

English language abstract of Japanese Publication No. 10-144250 May 29, 1998.

English language abstract of Korean Publication No. 1998-85877 Dec. 5, 1998.
English language abstract of Japanese Publication No. 06-223771.
English language abstract of Japanese Publication No. 10-144250.
English language abstract of Korean Publication No. 1998-85877.

* cited by examiner

ION SOURCE SECTION FOR ION IMPLANTATION EQUIPMENT

CROSS-REFERENCE TO RELATED APPLICATIONS

This U.S. non-provisional patent application claims priority under 35 U.S.C. § 119 of Korean Patent Application 2004-60811 filed on Aug. 2, 2004, the entire contents of which are hereby incorporated by reference.

BACKGROUND OF THE INVENTION

The present invention relates to ion implantation equipment used for semiconductor manufacturing processes, and more particularly, to an ion source section of ion implantation equipment for ionizing impurities used in an ion implantation process during semiconductor manufacturing processes to implant the ionized impurities into a substrate.

As well known, the ion implantation equipment is utilized for generating ion plasma in an arc chamber and extracting the plasma from the arc chamber by the difference in electrical potential energies to implant the extracted plasma into a wafer.

The ion implantation equipment provides a wide beam (or referred to as a ribbon beam) larger than the size of a wafer, e.g., 300 mm, generated in a horizontal direction. A wafer is scanned in a vertical direction to uniformly implant ions into the wafer.

Beam uniformity is very important and the slit of a plate of the arc chamber has the greatest influence on the beam uniformity. An ion beam is generated and initially discharged through the slit of the plate in the form of a beam line. The shape of the slit determines a beam profile.

However, since the slit of the plate is physically shocked by the ion beam and can easily deteriorate, the slit of the plate does not maintain its initial shape. The ion beam deforms to a shape corresponding to the deteriorated slit. Thus, with a deformed slit it is not possible to obtain desired beam uniformity.

In particular, the thickness of the slit of the plate is typically only 0.15 mm and can be easily deformed.

Therefore, to obtain excellent beam uniformity the plate must be periodically exchanged before the slit is excessively deformed. However, since the plate is formed of tungsten, having a high manufacturing cost, the frequent exchange of the plate undesirably increases maintenance and repair expenses.

SUMMARY OF THE INVENTION

Embodiments of the present invention provide an ion source section of ion implantation equipment with a shape capable of obtaining excellent beam uniformity. Embodiments of the present invention provide an ion source section of ion implantation equipment capable of reducing maintenance and repair expenses.

An ion source section of ion implantation equipment includes an arc chamber, a gas supply pipe for supplying reaction gas to the arc chamber, a filament for discharging thermal electrons to form an ion beam from the reaction gas supplied to the arc chamber, and a source aperture member separable from the arc chamber and having an ion-discharging hole through which the ion beam passes. The source aperture member has a multi-layer structure composed of two or more plates. According to one embodiment, the source aperture member comprises a first plate, a second plate adjacent to the first plate and with an inner surface facing the arc chamber, and a third plate at the inner surface of the second plate and exposed to the ion plasma.

According to the illustrated embodiment of the present invention, the second plate has an insertion groove receiving the third plate.

According to the illustrated embodiment of the present invention, a first aperture provided as the ion-discharging hole is formed in the first plate and a second aperture provided as the ion-discharging hole is formed in the second plate.

According to the illustrated embodiment of the present invention, the second plate is more adjacent to the arc chamber than the first plate and the first aperture comprises a first portion adjacent to the second plate and having the same width as the second aperture and comprises a second portion that extends from the first portion and whose width is reduces toward the second aperture.

According to the illustrated embodiment of the present invention, the second aperture comprises a third portion adjacent to the first portion and having the same width as the width of the first portion and comprises a fourth portion that extends from the third portion and whose width reduces toward the first aperture.

According to the illustrated embodiment of the present invention, the second aperture has planar inclined sidewalls and the first aperture has curved sidewalls.

According to the illustrated embodiment of the present invention, the first plate and the second plate are formed of different materials. The first plate and the third plate are formed of the same material.

BRIEF DESCRIPTION OF THE DRAWINGS

The accompanying drawings are included to provide a further understanding of embodiments of the invention, and are incorporated in and constitute a part of this specification. The drawings illustrate example embodiments of the present invention and, together with the description, serve to explain principles of embodiments of the present invention. In the drawings.

DETAILED DESCRIPTION OF PREFERRED EMBODIMENTS

Figure 1:
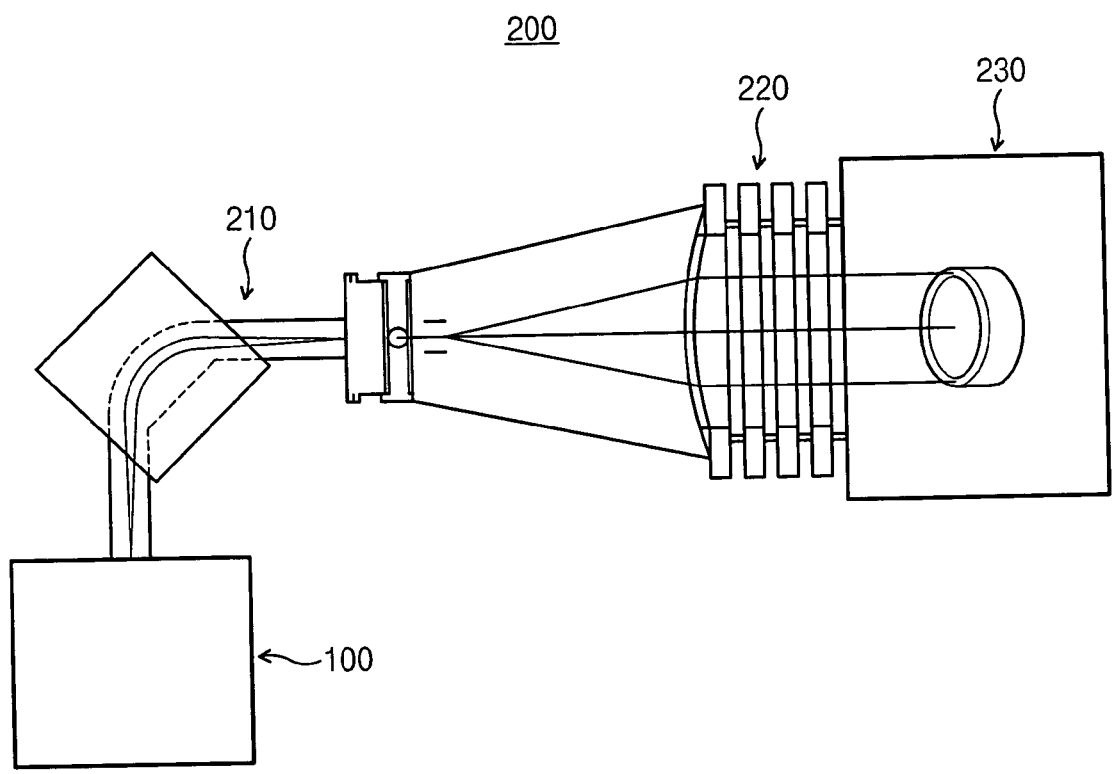
FIG. 1 schematically illustrates the structure of ion implantation equipment including an ion source section according to a preferred embodiment of the present invention.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity.

Hereinafter, the preferred embodiment of the present embodiment will be described in detail with reference to FIGS. 1 to 6. The same reference numerals in different drawings represent the same element throughout the specification.

FIG. 1 schematically illustrates the structure of ion implantation equipment that includes an ion source section according to a preferred embodiment of the present invention. In FIG. 1, ion implantation equipment 200 includes an ion source section 100 for ionizing reaction gas to form an ion beam, an analyzer 210 for separating undesirable kinds of ions from the ion beam, an accelerator 220 for accelerating the ion beam by energy in a predetermined range (for example, in the range of 2 KeV to 200 KeV), and a process chamber 230.

Figure 2:
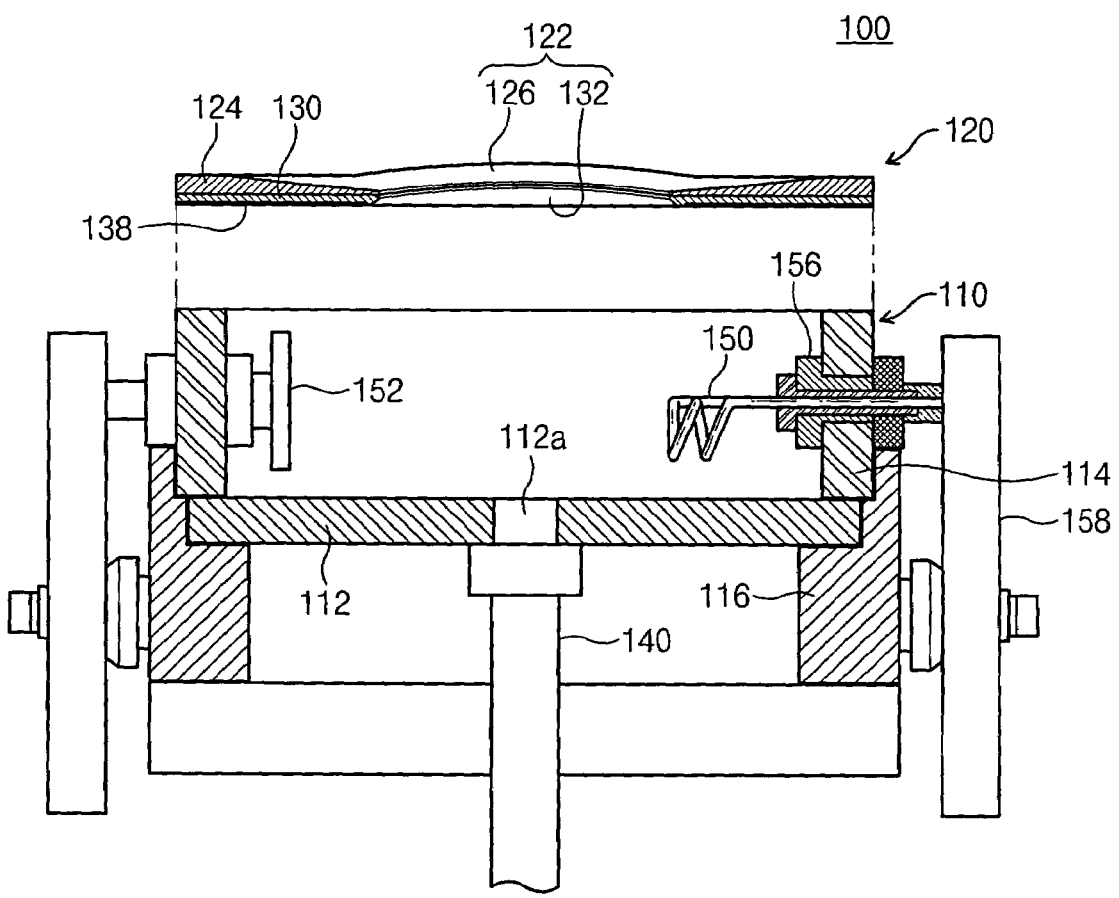
FIG. 2 is a sectional view illustrating an arc chamber of the ion source section of FIG. 1 according to the preferred embodiment of the present invention.

Referring to FIG. 2, the ion source section 100 embodiment of the present invention includes an arc chamber 110 for ionizing reaction gas. The arc chamber 110 includes a base plate 112 that forms the bottom and a side plate 114 that forms a side surface. The arc chamber 110 is substantially a closed box with a source aperture member 120 provided in one side of the arc chamber 110. Supporting blocks 116 on both sides of the lower end support the arc chamber 110.

In the arc chamber 110, a filament 150 is provided on one side surface and a reflector 152 is provided on the other surface that faces the filament 150. That is, the filament 150 and the reflector 152 are arranged to face each other in the arc chamber 110.

The filament 150 discharges thermal electrons to form an ion beam from the reaction gas supplied to the arc chamber 110. The filament 150, e.g., curved as in a Bernas type, has both ends passing through a common side surface and has insulating substances 156 interposed therebetween. Parts of the both ends of the filament 150 protrude to the outside of the arc chamber 110 and are fixed by a filament clamp 158. The reflector 152 resides on the other surface so as to face the filament as a reflector.

A gas spraying hole 112a is formed in the base plate 112 of the arc chamber 110 and a gas line 140 connects to the gas spraying hole 112a.

Processes forming an ion beam by the arc chamber 110 will be described. First, reaction gas that contains impurities, e.g., As, P, B, and Ar, is supplied from a reaction gas storage place (not shown) to the arc chamber 110 through the gas spraying hole 112a. When the reaction gas is provided to the arc chamber 110, current is applied to the filament 150 and thermal electrons are generated. The thermal electrons generated by the filament 150 collide with the reaction gas to discharge the electrons in the atoms or molecules of the reaction gas. The reaction gas is thereby ionized. The ionized reaction gas (ion beam) is discharged through an ion-discharging hole 122 of the source aperture member 120 and is accelerated by an accelerator to have predetermined energy such that the accelerated reaction gas is used in an ion implantation process.

Figure 3:
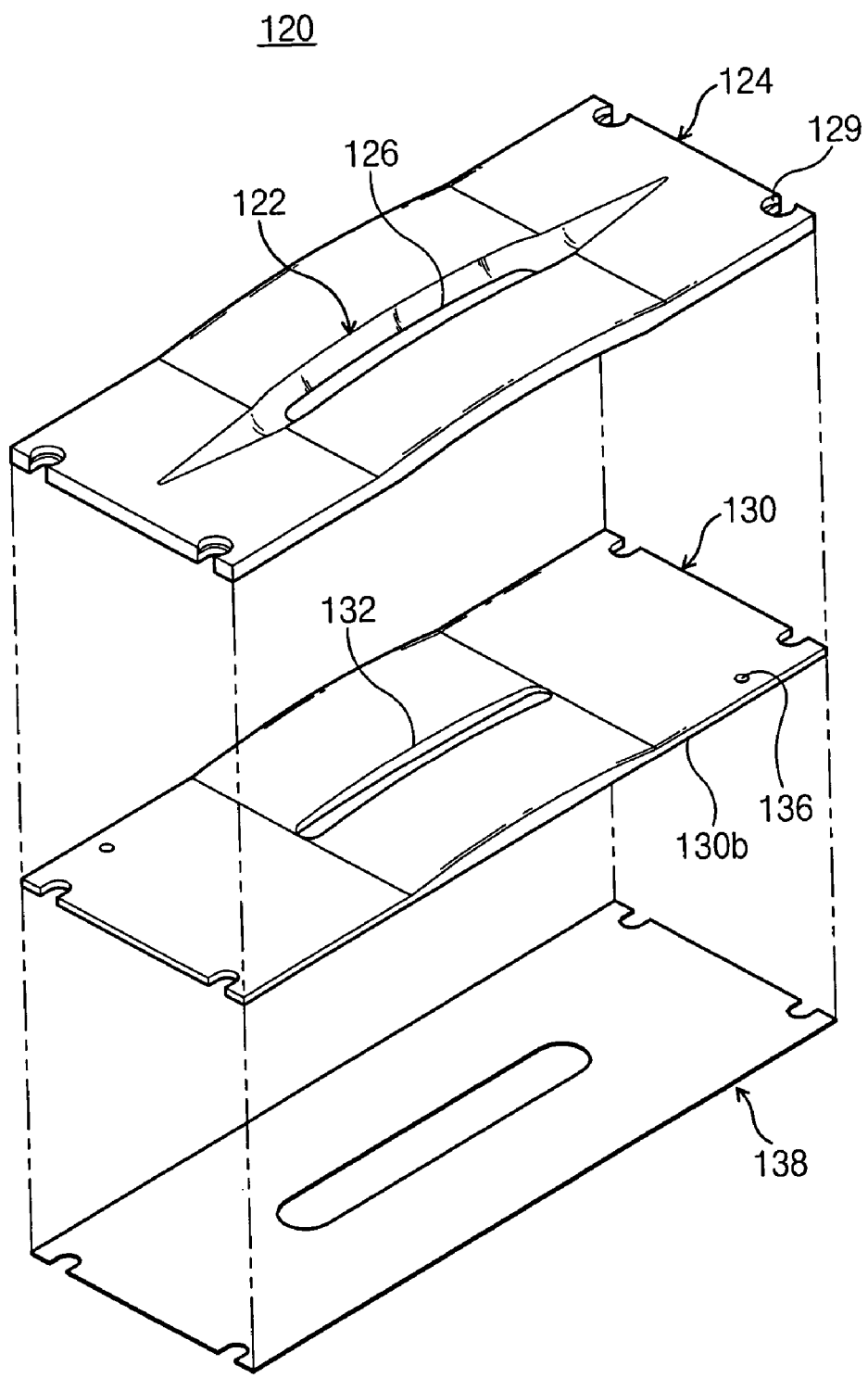
FIG. 3 is an exploded perspective view schematically illustrating a source aperture member in the ion source section according to embodiments of the present invention.

Referring to FIGS. 2 and 3, the source aperture member 120 forms that top surface of the arc chamber 110 having the ion-discharging hole 122. Locking grooves 129, into which locking members (not shown) are inserted to be combined with the arc chamber 110, are formed at the edges of the source aperture member 120. The ion-discharging hole 122 is in the form of a slit.

The source aperture member 120, in the illustrated embodiment, has a multi-layer structure composed of three plates. A first plate 124 and a third plate 138, each formed of tungsten, are arranged as outside plates. Within the source aperture member 120, a second plate 130, formed of graphite, resides between the first and third plates 124 and 138, respectively. The third plate 138 faces into the arc chamber and protects the inner surface 130b of the second plate 130, e.g., the surface of the second plate facing the inside of the arc chamber 110.

Figure 4A:
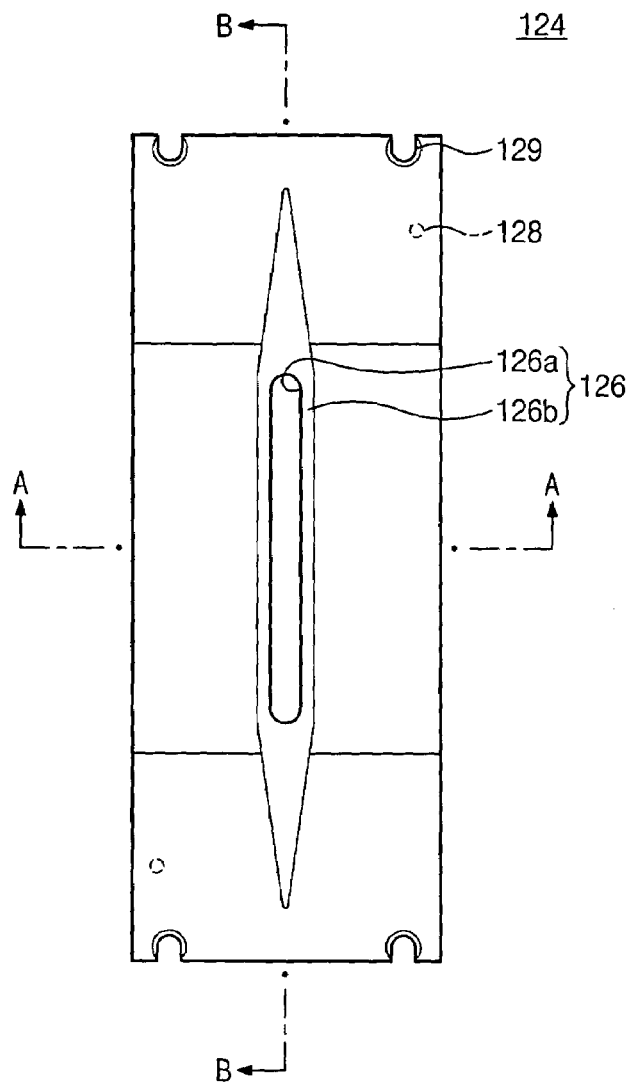
FIG. 4A is a plan view of a first plate of the source aperture member.
Figure 4B:
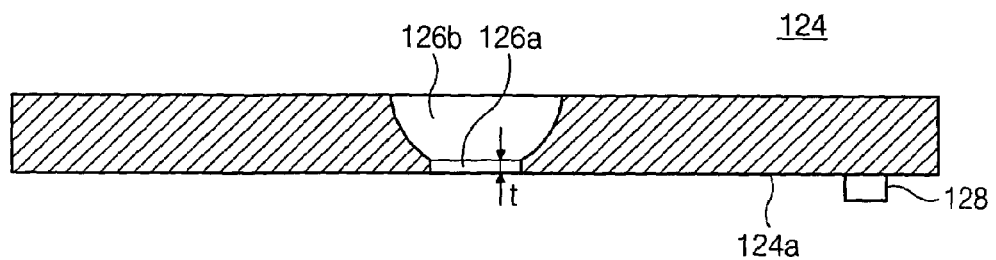
FIG. 4B is an enlarged sectional view of the first plate taken along the line A-A illustrated in FIG. 4A.
Figure 4C:
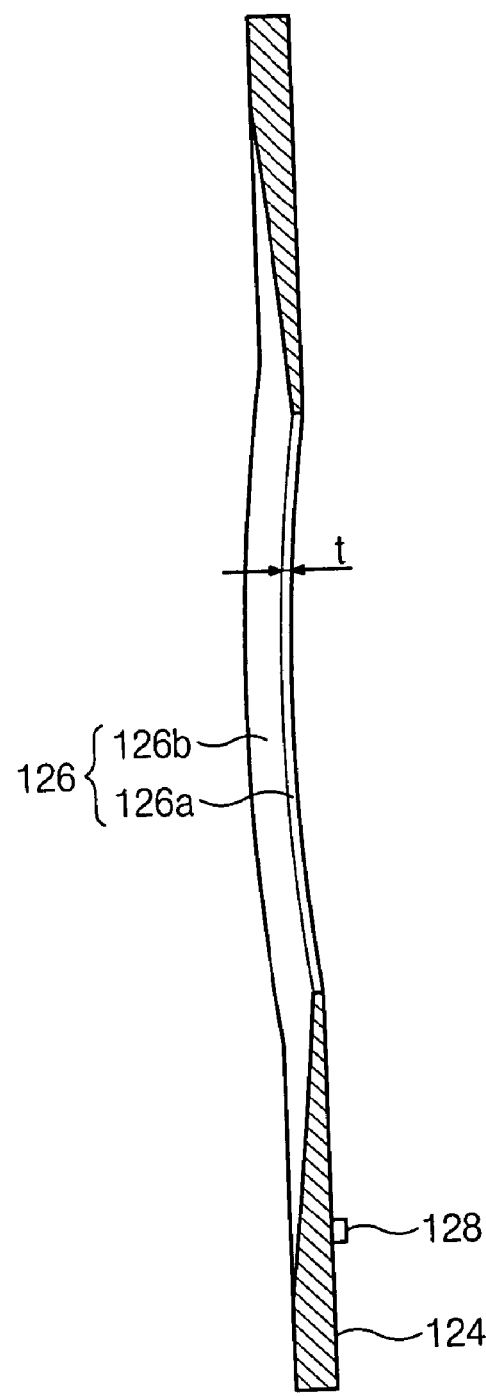
FIG. 4C is an enlarged sectional view of the first plate taken along the line B-B illustrated in FIG. 4A.

Referring to FIGS. 4A to 4C, the first plate 124 has a first aperture 126 acting as the ion-discharging hole 122. The first aperture 126 is divided into a first portion 126a and a second portion 126b. The first portion 126a has a uniform width and a thickness t of about 0.3 mm. The second portion 126b extends from the first portion 126a with curved sidewalls of width reducing in a direction toward the second aperture 130. The first plate 124 has two protrusions 128 on an inner surface 124a such that the first plate 124 is registered with the second plate 130.

Figure 5A:
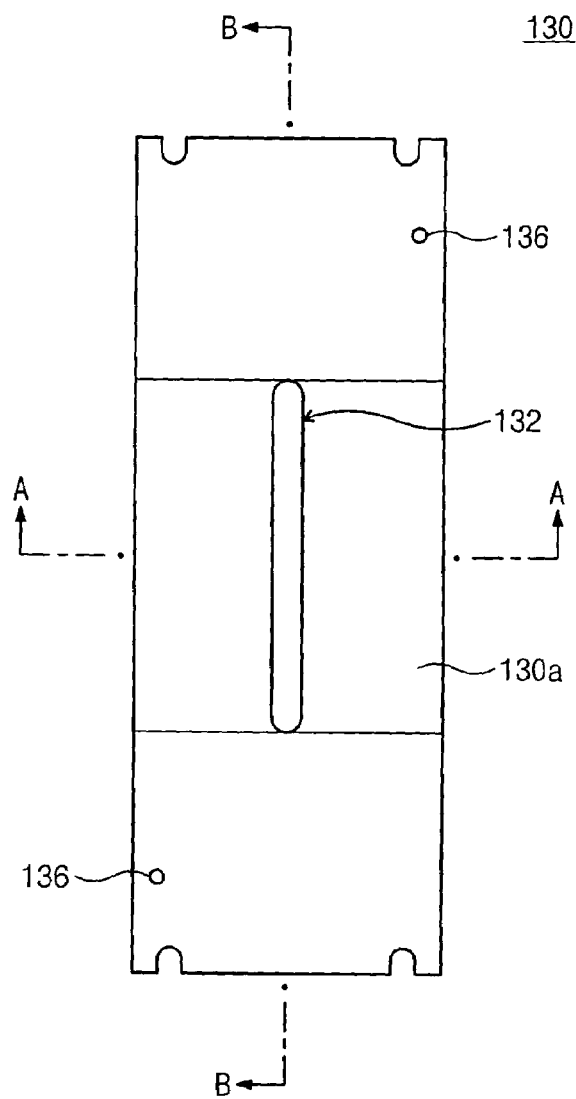
FIG. 5A is a plan view of a second plate of the source aperture member.
Figure 5B:
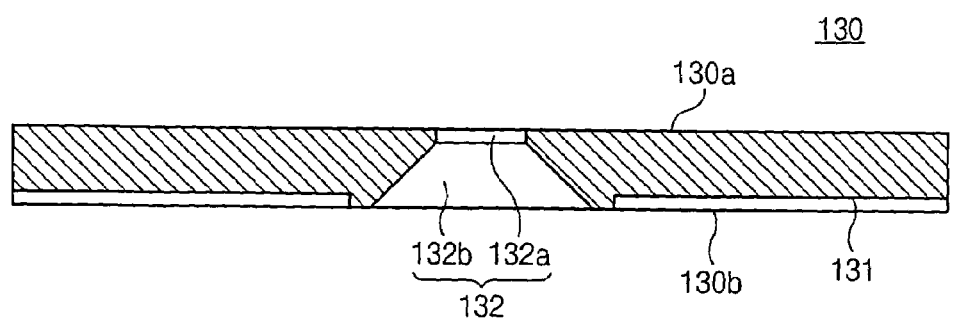
FIG. 5B is an enlarged sectional view of the second plate taken along the line A-A illustrated in FIG. 5A.
Figure 5C:
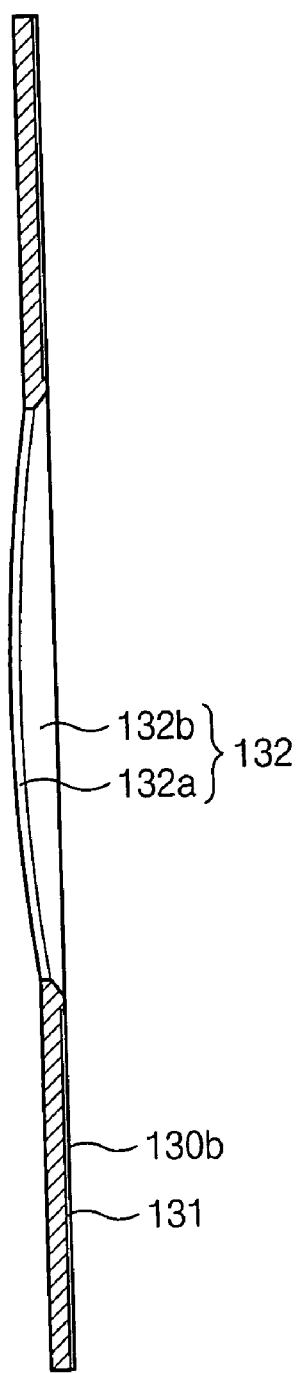
FIG. 5C is an enlarged sectional view of the second plate taken along the line B-B illustrated in FIG. 5A.

Referring to FIGS. 5A to 5C, the second plate 130 has a second aperture 132 provided as the ion discharging hole 122. The second aperture 132 is divided into a third portion 132a and a fourth portion 132b. The third portion 132a has uniform width corresponding to the width of the first portion 126a and has a thickness t of about 0.3 mm. The fourth portion 132b extends from the third portion 132a and its width reduces toward the third portion 132a along planar inclined sidewalls. The second plate 130 has two grooves 136 into which the protrusions 128 of the first plate 124 are inserted on the outer surface 130a thereof. An insertion groove 131, cut to the same depth as the thickness of the third plate 138, is provided in the inner surface 130b of the second plate. The third plate 138 is provided in the insertion groove 131.

With the source aperture member 120, the protrusions 128 of the first plate 124 are inserted into the grooves 136 of the second plate 130 such that the first aperture 126 correctly overlaps or aligns with the second aperture 132.

Figure 6:
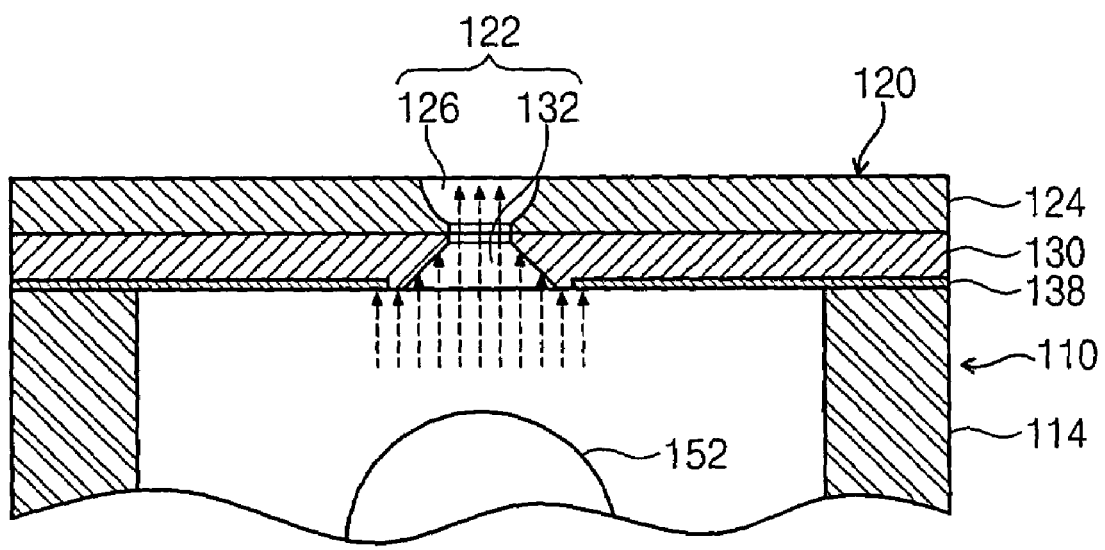
FIG. 6 schematically illustrates an ion beam discharged through an ion-discharging hole of the source aperture member.

As assembled, e.g., when the first plate 124, the second plate 130, and the third plate are assembled, the combined thickness of the second portion 126a and the third portion 132a is 0.6 mm. Thus, overall slit thickness of the source aperture member 120 is increased by 400% compared with the conventional technology. As illustrated in FIG. 6, the ion beam generated by the arc chamber 110 is discharged through the ion-discharging hole 122. In this process, plate degradation occurs as the ion beam physically shocks the second plate 130 and the first plate 124. Fortunately, the first plate 124 experiences less shock and, therefore, less degradation. Thus, when the ion implantation equipment is repaired, the second plate 130 of the source aperture member 120 may be exchanged but the first plate 124 may be used repeatedly. That is, it is possible to reduce the cost of exchanging the parts compared with the case in which the entire source aperture member is exchanged.

In particular, the first plate 124 and the third plate are used repeatedly and may be formed of tungsten material as in the conventional technology. The second plate 130 is more frequently replaced and may be formed of graphite. For example, when the second plate 130 is formed of graphite, it is possible to reduce manufacturing cost. Overall, endurance against physical shock and deterioration by the ion beam improved.

While this invention has been particularly shown and described with reference to preferred embodiments thereof, it will be understood by those skilled in the art that various changes in form and details may be made therein without departing from the spirit and scope of the invention as defined by the appended claims.

As described above, according to embodiments of the present invention, it is possible to obtain excellent beam uniformity through extended use of the ion implantation equipment by improving the structure of the source aperture member. It is possible to reduce the repair cost of the source aperture member by forming the second plate of graphite that is cheap and that has excellent endurance against deterioration. Also, it is possible to increase the life of the filament.

What is claimed is:

1. An ion source section of ion implantation equipment, comprising:
    an arc chamber;
    a gas supply pipe to supply reaction gas to the arc chamber;
    a filament to discharge thermal electrons and form an ion beam from the reaction gas; and
    a source aperture member separable from the arc chamber and having an ion discharging hole to discharge the ion beam,
    wherein the source aperture member has a multi-layer structure including a plurality of plates.

2. The ion source section of the ion implantation equipment as set forth in claim 1, wherein the source aperture member plurality of plates comprises:
    a first plate;
    a second plate adjacent to the first plate and having an inner surface facing the arc chamber; and
    a third plate provided on the inner surface of the second plate to protect the inner surface of the second plate against the ion beam.

3. The ion source section of ion implantation equipment as set forth in claim 2, wherein the second plate has an insertion groove cut to a predetermined depth and adapted to receive the third plate.

4. The ion source section of ion implantation equipment as set forth in claim 3, wherein the insertion groove predetermined depth corresponds to a thickness of the third plate.

5. The ion source section of ion implantation equipment as set forth in claim 2,
    wherein a first aperture formed in the first plate and a second aperture formed in the second plate provides the ion discharging hole.

6. The ion source section of ion implantation equipment as set forth in claim 5,
    wherein the second plate lies intermediate the arc chamber and the first plate, and
    wherein the first aperture comprises a first portion adjacent to the second plate and having substantially the same width and a second portion extending from the first portion with a width reducing toward the second aperture.

7. The ion source section of ion implantation equipment as set forth in claim 6, wherein the second aperture comprises a third portion adjacent to the first portion and having a uniform width corresponding to the uniform width of the first portion and a fourth portion extending from the third portion with a width reducing toward the first aperture.

8. The ion source section of ion implantation equipment as set forth in claim 7, wherein the second aperture comprises inclined planar sidewalls.

9. The ion source section of ion implantation equipment as set forth in claim 6, wherein the first aperture comprises curved sidewalls.

10. The ion source section of ion implantation equipment as set forth in claim 7, wherein the sum of the thickness of the first portion of the ion discharging hole and the thickness of the third portion of the ion discharging hole is on the order of 0.6 mm.

11. The ion source section of ion implantation equipment as set forth in claim 1, wherein the ion-discharging hole is in the form of a slit.

12. The ion source section of ion implantation equipment as set forth in claim 2, wherein the first plate and the second plate comprise different materials.

13. The ion source section of ion implantation equipment as set forth in claim 2, wherein the first plate and the third plate comprise substantially similar material.

14. The ion source section of ion implantation equipment as set forth in claim 13, wherein the first plate and the third plate comprise tungsten.

15. The ion source section of ion implantation equipment as set forth in claim 12, wherein the second plate comprises graphite.

16. An ion source section of ion implantation equipment, comprising:
    an arc chamber;
    a gas supply pipe to supply reaction gas to the arc chamber;
    a filament to discharge thermal electrons and form an ion beam from the reaction gas within the arc chamber; and
    a source aperture member separable from the arc chamber and having an ion discharging hole to discharge the ion beam,
    wherein the source aperture member comprises an outside plate, an inside plate, and at least one middle plate interposed therebetween, the at least one middle plate comprising graphite.

17. The ion source section of ion implantation equipment as set forth in claim 16, wherein the outside plate and the inside plate comprise tungsten.

18. The ion source section of ion implantation equipment as set forth in claim 17, wherein the at least one middle plate comprises graphite.

19. The ion source section of ion implantation equipment as set forth in claim 16, wherein the outside plate and the at least one middle plate cooperatively form the discharge hole including a central portion of uniform width provided by the outside plate and by the at least one middle plate, an outside portion provided by the outside plate and of width expanding in a direction away from the at least one middle plate, and an inner portion provided by the at least one middle plate and of width expanding in a direction away from the outside plate.

20. The ion source section of ion implantation equipment as set forth in claim 19, wherein the outside plate and the inside plate comprise tungsten and wherein the middle plate comprises graphite.

21. The ion source section of ion implantation equipment as set forth in claim 19, wherein the central portion of the discharging hole comprises a thickness on the order of 0.6 mm.

22. An ion source section of ion implantation equipment, comprising:
    an ion beam source for ionizing reaction gas; and
    a source aperture member having an ion discharging hole to discharge the ionized reaction gas therethrough from the ion beam source as an ion beam, the source aperture member including a plurality of plates comprising different materials, wherein sidewalls of the ion discharging hole have a varying height from one end of the ion discharging hole to another end of the ion discharging hole.

23. The ion source section of ion implantation equipment as set forth in claim 22, wherein the source aperture member comprises:
   a first plate most distant from the ion beam source;
   a second plate intermediate the first plate and the ion beam source and having an inner surface facing the ion beam source; and
   a third plate provided on the inner surface of the second plate to protect the inner surface against the ion beam source.

24. The ion source section of ion implantation equipment as set forth in claim 23, wherein a first aperture provided in the first plate and a second aperture provided in the second plate cooperatively form the ion discharging hole, wherein the ion-discharging hole is in the form of a slit, and wherein the first aperture provided in the first plate and the second aperture provided in the second plate cooperatively increase a thickness of the slit.

25. The ion source section of ion implantation equipment as set forth in claim 24, wherein the first and third plates comprise tungsten and the second plate comprises graphite.

26. The ion source section of ion implantation equipment as set forth in claim 24, wherein the first aperture comprises curved sidewalls establishing an expanding width of the first aperture in a direction away from the second plate.

27. The ion source section of ion implantation equipment as set forth in claim 24, wherein the second aperture comprises inclined planar sidewalls establishing an expanding width of the second aperture in a direction away from the first plate.

28. The ion source section of ion implantation equipment as set forth in claim 24, wherein the first aperture and second aperture cooperatively form a central portion of the ion discharging hole having a uniform width.

29. The ion source section of ion implantation equipment as set forth in claim 24, wherein the third plate lies against inner-facing surface of the second plate to protect the inner surface of the second plate against the ion beam source.

30. The ion source section of ion implantation equipment as set forth in claim 23,
   wherein a first aperture provided in the first plate and a second aperture provided in the second plate cooperatively form the ion discharging hole;
   the first and third plates comprise tungsten and the second plate comprises graphite;
   the first aperture comprises curved sidewalls establishing an expanding width of the first aperture in a direction away from the second plate;
   the second aperture comprises inclined planar sidewalls establishing an expanding width of the second aperture in a direction away from the first plate;
   the first aperture and second aperture cooperatively form a central portion of the ion discharging hole having a uniform width; and
   the third plate lies against inner-facing surface of the second plate to protect the inner surface of the second plate against the ion beam source.

31. A method of discharging an ion beam comprising:
   providing ionized gas within an arc chamber;
   locating a source aperture member in direct contact with the ionized gas contained within the arc chamber, the source aperture member including at least two plates having discharge openings;
   dismounting a first one of the at least two plates of the source aperture member;
   mounting a replacement plate in place of the first one of the at least two plates;
   leaving in use a second one of the at least two plates; and
   discharging the ionized gas through each discharge opening of the source aperture member,
   wherein one of the at least two plates comprises a material that degrades at a faster rate than a material of another of the at least two plates when subjected to the ionized gas.

32. The method of discharging an ion beam according to claim 31, further comprising:
   halting discharging the ion beam through the discharge openings of the source aperture member before dismounting the first one of the at least two plates of the source aperture member; and
   resuming passing the ion source through the discharge openings of the source aperture member after mounting the replacement plate in place of the first one of the at least two plates.

33. The method of discharging an ion beam according to claim 32, wherein the first plate and second plate comprise different materials.

34. The method of discharging an ion beam according to claim 33, wherein the first plate comprises graphite and the second plate comprises tungsten.

35. In an ion beam generator, an improvement comprising a multi-plate discharge hole configured to discharge ionized reaction gas therethrough from an ion beam source, the multi-plate discharge hole being defined through a plurality of plates that contact each other, wherein sidewalls of the ion discharging hole have a varying height from one end of the ion discharging hole to another end of the ion discharging hole.

36. The ion beam generator according to claim 35, wherein the multi-plate discharge hole comprises plates comprising different materials, wherein the ion-discharging hole is in the form of a slit, and wherein the first aperture provided in the first plate and the second aperture provided in the second plate cooperatively increase a thickness of the slit.

37. The ion beam generator according to claim 36, wherein the different materials comprise tungsten and graphite.

38. The ion beam generator according to claim 35, wherein the multi-plate discharge hole comprises:
   a first plate locatable most distant from the ion beam source;
   a second plate locatable intermediate the first plate and the ion beam source and having an inner surface facing the ion beam source; and
   a third plate locatable on the inner surface of the second plate to protect the inner surface against the ion beam source.

39. The ion beam generator according to claim 38, wherein a first aperture provided in the first plate and a second aperture provided in the second plate cooperatively form the ion discharging hole.

40. The ion beam generator according to claim 39, wherein the first aperture comprises curved sidewalls establishing an expanding width of the first aperture in a direction away from the second plate.

41. The ion beam generator according to claim 39, wherein the second aperture comprises inclined planar sidewalls establishing an expanding width of the second aperture in a direction away from the first plate.

42. The ion beam generator according to claim 39, wherein the first aperture and second aperture cooperatively form a central portion of the ion discharging hole having a uniform width.

43. The ion beam generator according to claim 39, wherein the third plate lies against inner-facing surface of the second plate to protect the inner surface of the second plate against the ion beam source.

44. The ion beam generator according to claim 38, wherein the first and third plates comprise tungsten and the second plate comprises graphite.

45. The ion source section of ion implantation equipment as set forth in claim 22, wherein the source aperture member is separable from the ion beam source.

46. The ion beam generator according to claim 35, wherein the multi-plate discharge hole is separable from an ion beam source of the ion beam generator.

47. An ion source section of ion implantation equipment, comprising:
  an ion beam source for ionizing reaction gas; and
  a source aperture member having an ion discharging hole to discharge the ionized reaction gas therethrough from the ion beam source as an ion beam, the source aperture member including a plurality of plates comprising different materials,
  wherein the source aperture member is separable from the ion beam source.

48. In an ion beam generator, an improvement comprising a multi-plate discharge hole configured to discharge ionized reaction gas therethrough from an ion beam source, the multi-plate discharge hole being defined through a plurality of plates that contact each other, wherein the multi-plate discharge hole is separable from an ion beam source of the ion beam generator.

49. An ion source section of ion implantation equipment, comprising:
  an ion beam source for ionizing reaction gas; and
  a source aperture member having an ion discharging hole to discharge the ionized reaction gas therethrough from the ion beam source as an ion beam, the source aperture member including a plurality of plates comprising different materials, wherein the source aperture member further comprises:
    a first plate most distant from the ion beam source;
    a second plate intermediate the first plate and the ion beam source and having an inner surface facing the ion beam source; and
    a third plate provided on the inner surface of the second plate to protect the inner surface against the ion beam source, wherein:
  a first aperture provided in the first plate and a second aperture provided in the second plate cooperatively form the ion discharging hole; and
  the second aperture comprises inclined planar sidewalls establishing an expanding width of the second aperture in a direction away from the first plate.

50. An ion source section of ion implantation equipment, comprising:
  an ion beam source for ionizing reaction gas; and
  a source aperture member having an ion discharging hole to discharge the ionized reaction gas therethrough from the ion beam source as an ion beam, the source aperture member including a plurality of plates comprising different materials, wherein the source aperture member further comprises:
    a first plate most distant from the ion beam source;
    a second plate intermediate the first plate and the ion beam source and having an inner surface facing the ion beam source; and
    a third plate provided on the inner surface of the second plate to protect the inner surface against the ion beam source, wherein:
  a first aperture provided in the first plate and a second aperture provided in the second plate cooperatively form the ion discharging hole;
  the first and third plates comprise tungsten and the second plate comprises graphite;
  the first aperture comprises curved sidewalls establishing an expanding width of the first aperture in a direction away from the second plate;
  the second aperture comprises inclined planar sidewalls establishing an expanding width of the second aperture in a direction away from the first plate;
  the first aperture and second aperture cooperatively form a central portion of the ion discharging hole having a uniform width; and
  the third plate lies against inner-facing surface of the second plate to protect the inner surface of the second plate against the ion beam source.

51. In an ion beam generator, an improvement comprising a multi-plate discharge hole configured to discharge ionized reaction gas therethrough from an ion beam source, the multi-plate discharge hole being defined through a plurality of plates that contact each other, wherein the multi-plate discharge hole further comprises:
  a first plate locatable most distant from the ion beam source;
  a second plate locatable intermediate the first plate and the ion beam source and having an inner surface facing the ion beam source; and
  a third plate locatable on the inner surface of the second plate to protect the inner surface against the ion beam source, wherein:
  a first aperture provided in the first plate and a second aperture provided in the second plate cooperatively form the ion discharging hole; and
  the second aperture comprises inclined planar sidewalls establishing an expanding width of the second aperture in a direction away from the first plate.

* * * * *